US011856686B1

(12) United States Patent
Magcale et al.

(10) Patent No.: US 11,856,686 B1
(45) Date of Patent: Dec. 26, 2023

(54) SUBMERGED DATA CENTER FACILITY SYSTEM AND METHOD

(71) Applicant: Nautilus TRUE, LLC, San Ramon, CA (US)

(72) Inventors: Arnold Castillo Magcale, San Ramon, CA (US); Byron Taylor, Pleasanton, CA (US)

(73) Assignee: Nautilus TRUE, LLC, San Ramon, CA (US)

( * ) Notice: Subject to any disclaimer, the term of this patent is extended or adjusted under 35 U.S.C. 154(b) by 0 days.

(21) Appl. No.: 16/203,490

(22) Filed: Nov. 28, 2018

(51) Int. Cl.
| | |
|---|---|
| *B63G 8/36* | (2006.01) |
| *B63G 8/14* | (2006.01) |
| *H05K 7/20* | (2006.01) |
| *H05K 7/14* | (2006.01) |
| *G06F 1/20* | (2006.01) |
| *G05B 13/02* | (2006.01) |

(52) U.S. Cl.
CPC .......... *H05K 7/20836* (2013.01); *B63G 8/14* (2013.01); *B63G 8/36* (2013.01); *G05B 13/024* (2013.01); *G05B 13/026* (2013.01); *G06F 1/206* (2013.01); *H05K 7/1497* (2013.01); *H05K 7/2079* (2013.01); *H05K 7/20263* (2013.01); *H05K 7/20272* (2013.01); *B63B 2211/00* (2013.01)

(58) Field of Classification Search
CPC ..... H05K 7/1497; B63G 8/36; B63B 2702/12
See application file for complete search history.

(56) References Cited

U.S. PATENT DOCUMENTS

| | | | | |
|---|---|---|---|---|
| 5,306,183 | A * | 4/1994 | Holt | B63H 5/14 310/114 |
| 7,518,952 | B1 * | 4/2009 | Padden | H04B 3/52 367/131 |
| 9,784,460 | B2 | 10/2017 | Magcale et al. | |
| 2005/0166827 | A1 * | 8/2005 | Holmes | B63G 8/42 114/330 |
| 2008/0209234 | A1 * | 8/2008 | Clidaras | F03B 13/1885 713/300 |
| 2009/0067289 | A1 * | 3/2009 | Lee | G01S 15/74 367/87 |
| 2013/0201316 | A1 * | 8/2013 | Binder | H04L 67/12 348/77 |
| 2015/0027155 | A1 * | 1/2015 | Maruyama | F25B 31/006 62/228.1 |
| 2016/0075569 | A1 * | 3/2016 | Constantz | H05K 7/1497 210/652 |
| 2016/0284962 | A1 * | 9/2016 | Harding | H05K 7/20736 |
| 2017/0113773 | A1 * | 4/2017 | Kaiser | H02K 21/12 |
| 2017/0215299 | A1 * | 7/2017 | James | F03B 13/22 |
| 2018/0001249 | A1 * | 1/2018 | Sher | B01D 45/02 |
| 2019/0199450 | A1 * | 6/2019 | Yoshida | H04B 1/0475 |

* cited by examiner

*Primary Examiner* — Christopher E. Everett
*Assistant Examiner* — Tameem D Siddiquee
(74) *Attorney, Agent, or Firm* — Wilson Sonsini Goodrich & Rosati

(57) ABSTRACT

A submerged waterborne data center facility that employs a feedback-control system to control any one of a condensation function, depth function, and a wired or wireless data transfer function utilizing on-board and out-board sensors operatively coupled to an operational state change controller, controlling for a hygrostat-coupled heater, depth thruster, and, or a radio frequency modulation unit.

18 Claims, 9 Drawing Sheets

Waterborne Data Center - Front Sectional View

Waterborne Data Center – Front Sectional View

Heat Exchange and Closed-Loop Cooling – Side Sectional View

Thermal Containment Top Closed-Loop Cooling – Sectional Views

Thermal Containment Rear Closed-Loop Cooling – Sectional Views

Waterborne Data Center - Side Sectional View

Waterborne Data Center – Top Sectional View

Waterborne Data Center – Top Sectional View – Below Main Deck

SUBMERGED DATA CENTER FACILITY SYSTEM AND METHOD

CROSS REFERENCE TO RELATED APPLICATIONS

This application incorporates by reference in its entirety U.S. Pat. No. 9,784,460 application Ser. No. 14/200,461 filed on Mar. 7, 2014, entitled "A waterborne data center facility and process that utilizes a closed-looped heat management system", which claims the benefit of Provisional Patent application No. 61/861,197 filed on Aug 1, 2013, entitled "A waterborne data center facility and process that utilizes a closed-looped heat management system that is both energy efficient and cost effective".

FIELD

The present invention relates to data center facilities housed on marine vessels and submerged enclosures.

BACKGROUND OF THE INVENTION

Data centers and co-location providers in particular struggle with both supplying requisite power as well as cooling. As data center density continues to increase there is a growing demand for more energy efficient and cost effective data centers and co-location solutions.

A data center is designed to maintain interior ambient conditions suitable for proper operation of the computer systems therein. Condensation build-up within electronic components is a major potential issue given the proximity to water—for both marine vessel-housed and water-submerged data centers. Moreover, submerged data centers may additionally result in significant packet loss depending on the depth of the enclosure. Additionally, typical data centers may consume more than twice the power needed to support the plurality of computer systems housed therein. This is a result of the inefficient air conditioning units that may account for half of the total power consumed in the data center to cool the plurality of computer systems therein. This inefficiency prohibits support of high density computing systems in today's data centers.

Embodiments disclose a waterborne data center facility employing a closed-looped, energy efficient, cost effective thermal management system that leverages natural surrounding resources to control thermal conditions and reduce the overall requirement for cooling power—on-board a marine vessel or housed within a submerged enclosure. Finally, extant solutions do not address the issue of wireless data transfer and condensation control for submerged data centers.

SUMMARY

Embodiments disclosed include a submersible marine vessel comprising a heat exchange system, a computer data center, wherein the computer data center comprises a plurality of computing units, and wherein the computer data center is comprised in the submersible marine vessel. The submersible marine vessel further comprises an electrical power generator, a thermal containment system, a hot water return cooling system, and a software management suite. Preferably, the submersible marine vessel comprises a bow section, a stern section, a starboard section, and a port section. An alternate embodiment includes a thermal airflow system in the submersible marine vessel.

According to an embodiment of the submersible marine vessel the heat exchange system further comprises a closed loop coolant distribution unit coupled to a water based cooling system comprising a single or plurality of filtered water intake pipes and water exhaust pipes via a single or plurality of heat exchangers and corresponding heat exchange piping. The embodiment includes a single or plurality of water pumps and coolant distribution piping.

According to an embodiment of the submersible marine vessel the software management suite further comprises a Data Center Infrastructure Management (DCIM) system with predictive analytics configured for continuously collecting and analyzing data from a plurality of infrastructure systems, components and sensors.

An embodiment of the submersible marine vessel includes a hull section wherein the heat exchange system is partially or completely comprised in the hull of the marine vessel, making for a hull heat exchange system, or a hull heat exchanger.

Embodiments disclosed include, in a submersible marine vessel comprising a data center facility, a method comprising generating electrical power and providing the generated electrical power to the data-center, wherein any excess power is stored as back up in the submersible marine vessel. The method includes pumping surrounding water and circulating the pumped water through a closed loop cooling system, wherein the closed loop cooling system is comprised in a heat exchanger. Preferably the surrounding water is drawn by water pumps through filtered water intake pipes to be pumped through a first side of the heat exchanger, where it serves as a heat sink to cool hot coolant from a coolant distribution unit, pumped through a second side of the heat exchanger. Finally, the pumped water is expelled after absorbing the heat from the hot coolant through filtered water exhaust pipes in the method.

According to an embodiment, the method further comprises collecting of environmental data by a plurality of infrastructure systems, components and sensors, storing the collected data in a database, analyzing the stored data by a predictive analytics engine, wherein the analyzed data is employed by a Data Center Infrastructure Management (DCIM) element controller to manage infrastructure systems and components' operational states.

According to a preferred embodiment, the method further comprises controlling a condensation function, a depth function, and wireless data transfer function based on a feedback-control system, housed within the submersible marine vessel.

DETAILED DESCRIPTION OF THE INVENTION

As stated above, Data centers and co-location providers in particular struggle with both supplying requisite power as well as cooling. As data center density continues to increase there is a growing demand for more energy efficient and cost effective data centers and co-location solutions. The invention claimed here solves this problem.

Through our holistic approach to data center architecture, thermal management and energy consumption, we are creating state-of-the-art waterborne data center facilities that maximize efficiencies by leveraging technology and the surrounding environment, with virtually no ecological impact, ultimately passing substantial savings on energy spent to our partners and customers.

The claimed invention differs from, and is an improvement on what currently exists. Embodiments disclose a waterborne solution to data center thermal management and energy consumption. Preferred embodiments are designed to maximize efficiencies by leveraging technology and Nature with virtually no impact to the surrounding environment, resulting in substantial costs savings passed on to customers.

Computer room air conditioner (CRAC) units are poorly designed for data centers because they are energy inefficient and are typically designed to be approximately 6' tall, limiting the ability of the units to treat the hottest air in the data center which rises closer to ceiling height. Hot air and cold air are allowed to freely mix in today's typical data center, which greatly reduces the efficiency of cooling systems.

Embodiments of our waterborne data center facility employ a closed-looped, energy efficient, cost effective thermal management system that leverages natural resources to control thermal conditions and reduce the overall requirement for cooling power.

Figure 1:
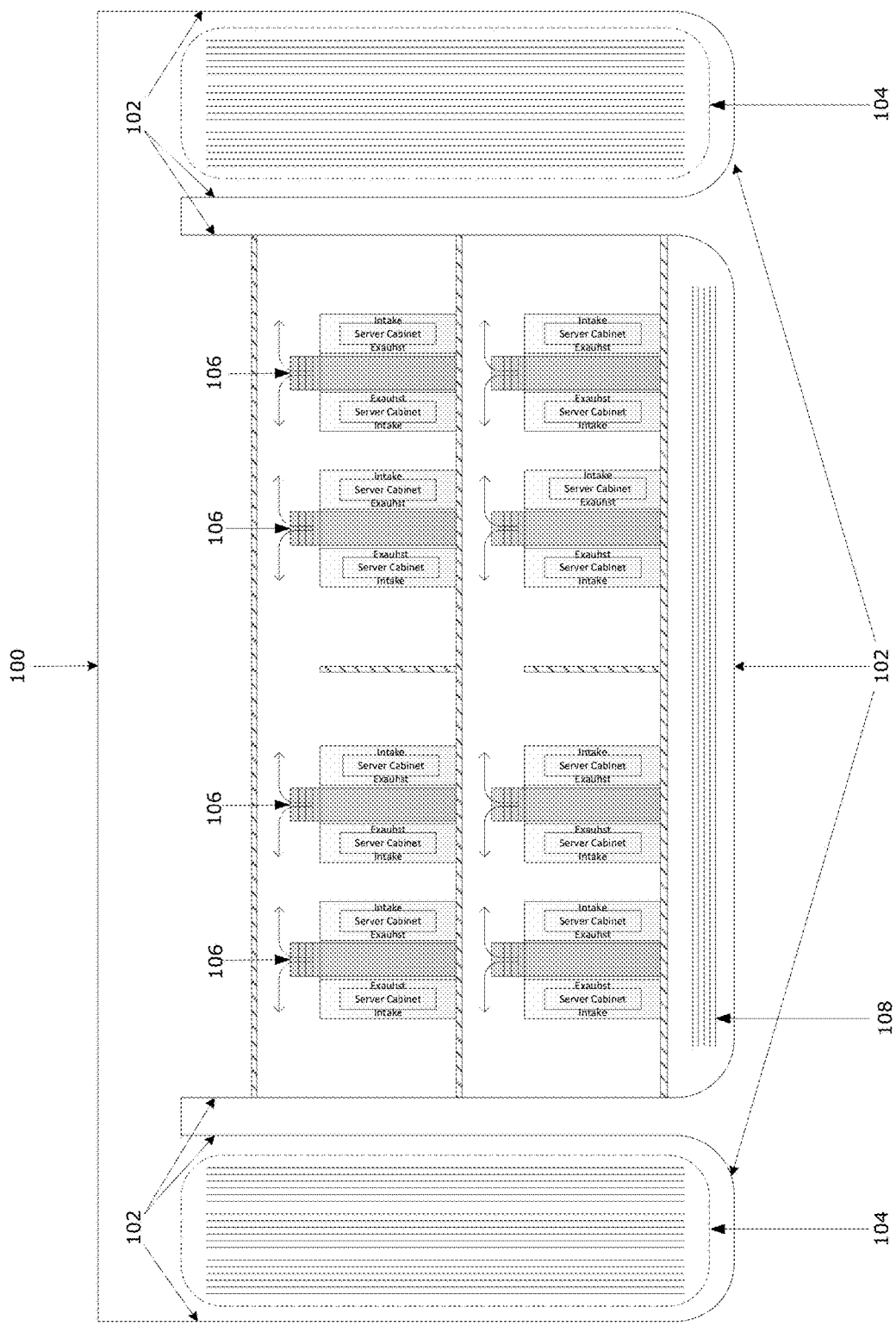
FIG. 1 illustrates a waterborne data center front sectional view
Figure 2:
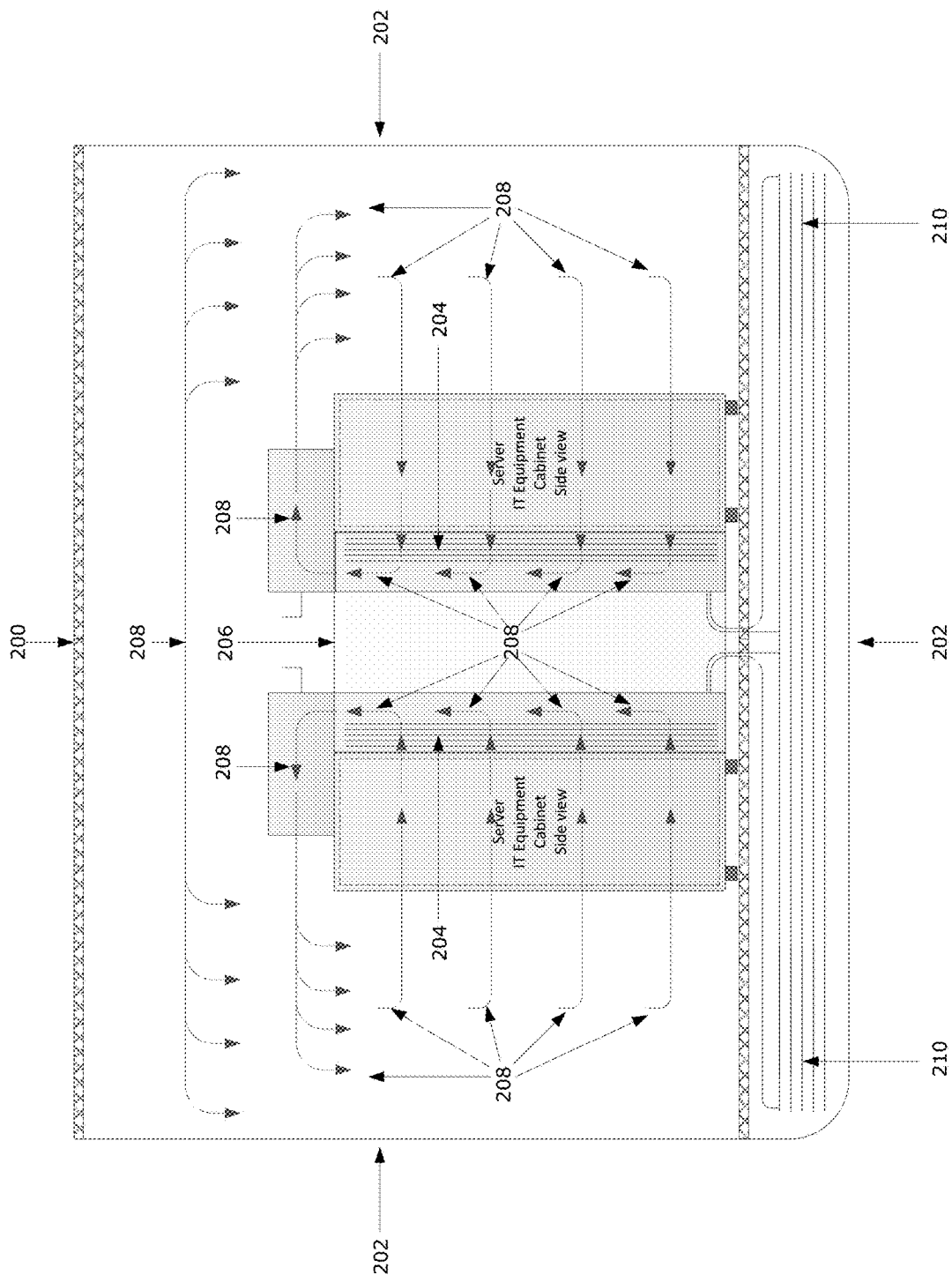
FIG. 2 illustrates a heat exchange and closed-loop cooling side sectional view
Figure 3:
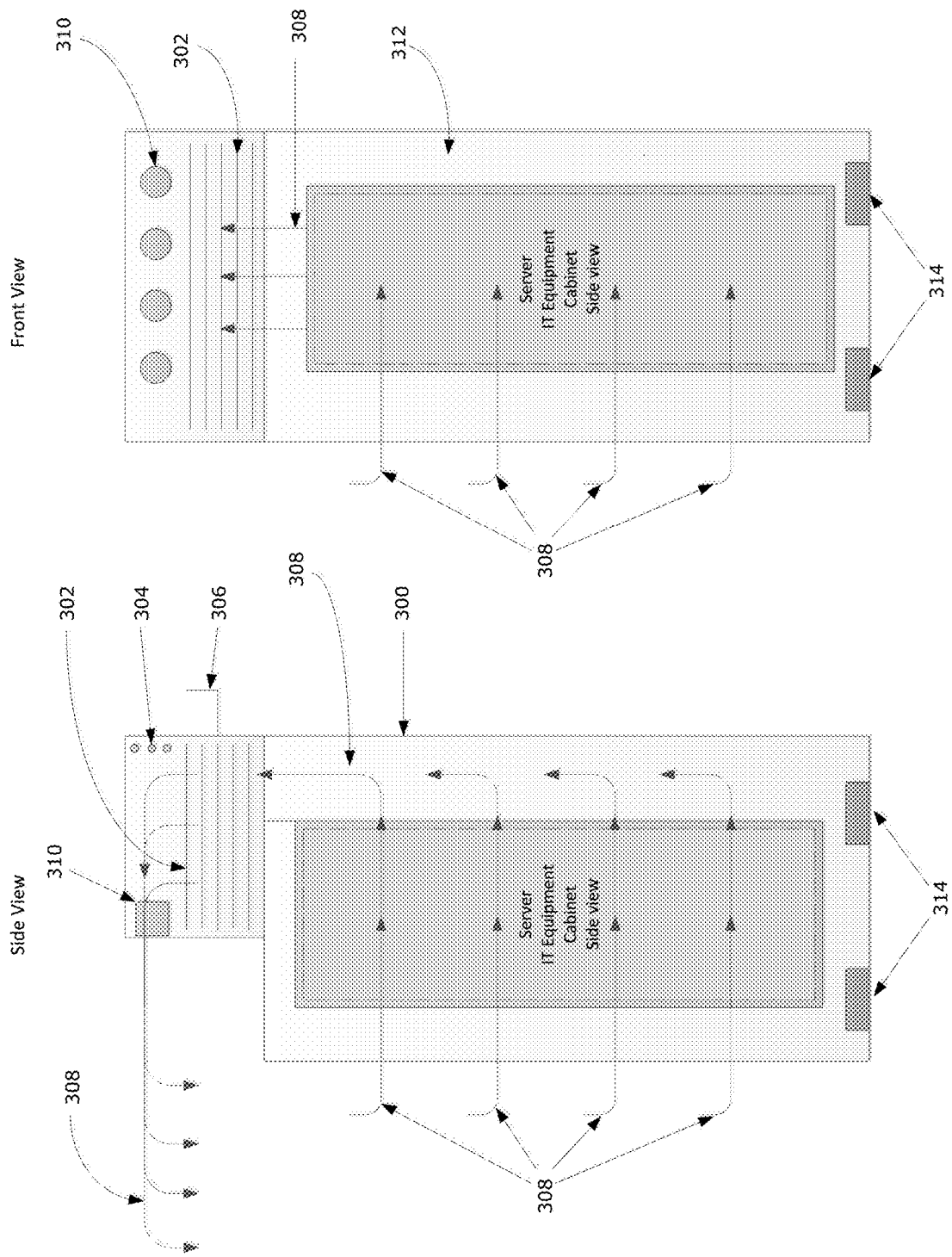
FIG. 3 illustrates a thermal containment top closed-loop cooling sectional view
Figure 4:
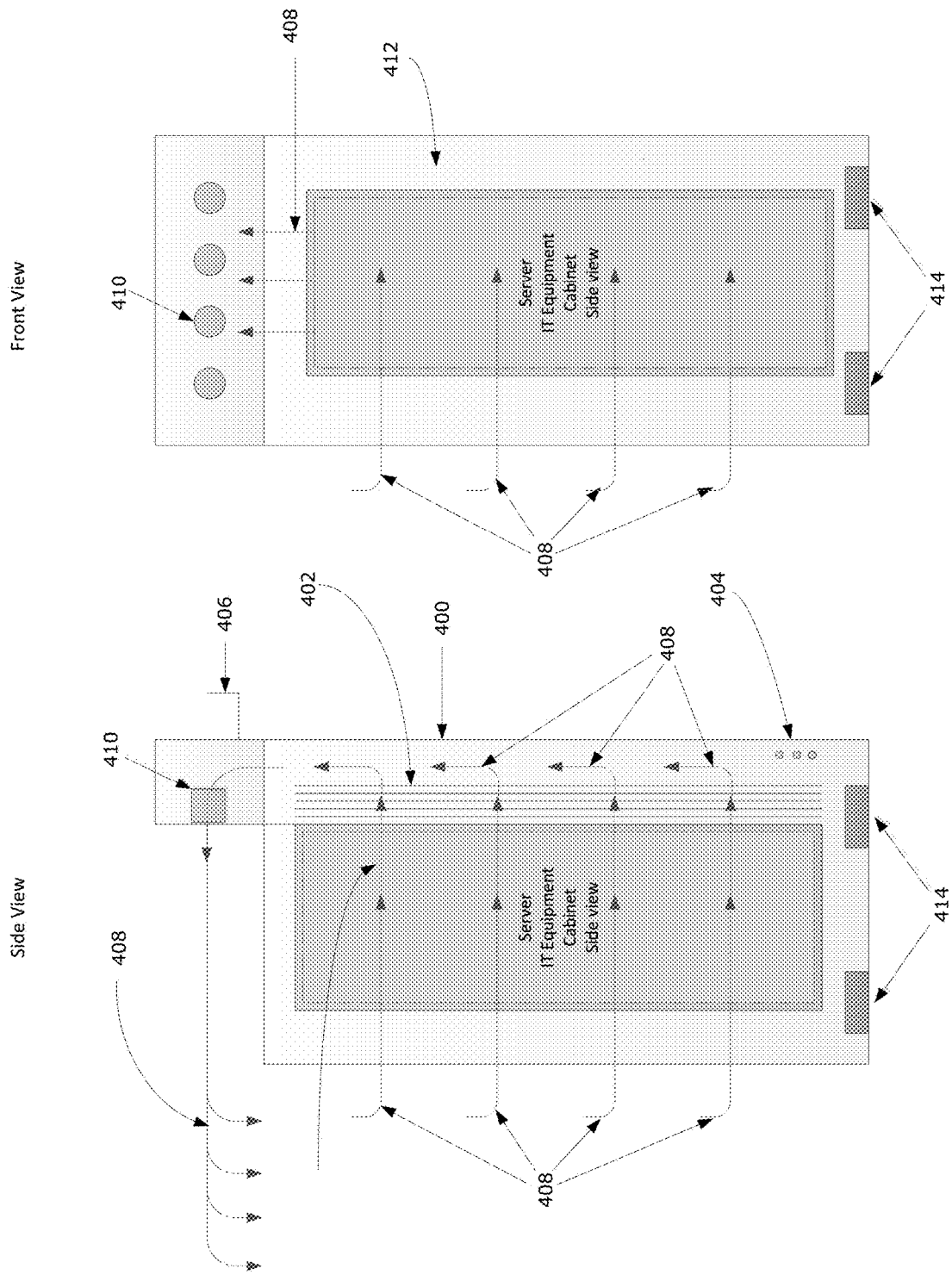
FIG. 4 illustrates a thermal containment rear closed-loop cooling sectional view
Figure 5:
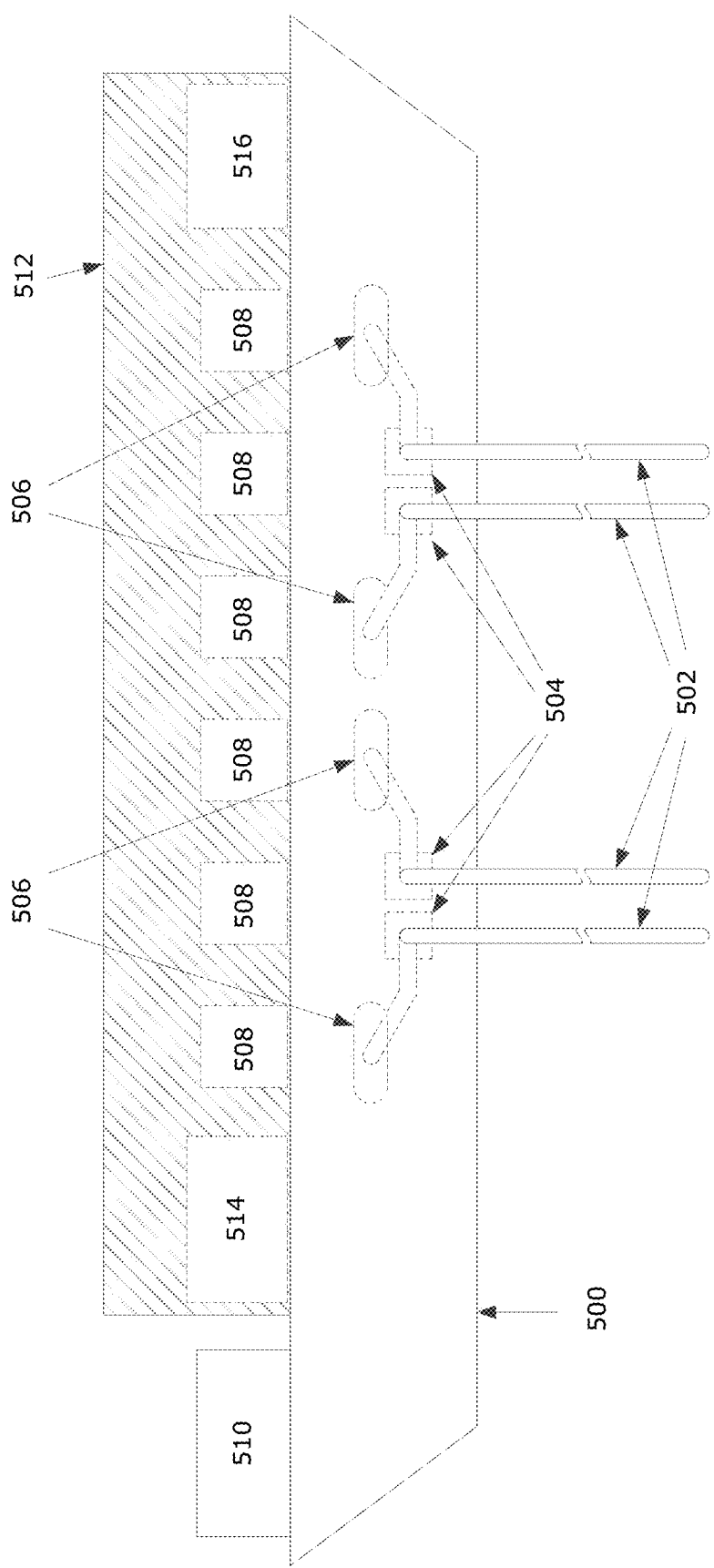
FIG. 5 illustrates a waterborne data center side sectional view
Figure 6:
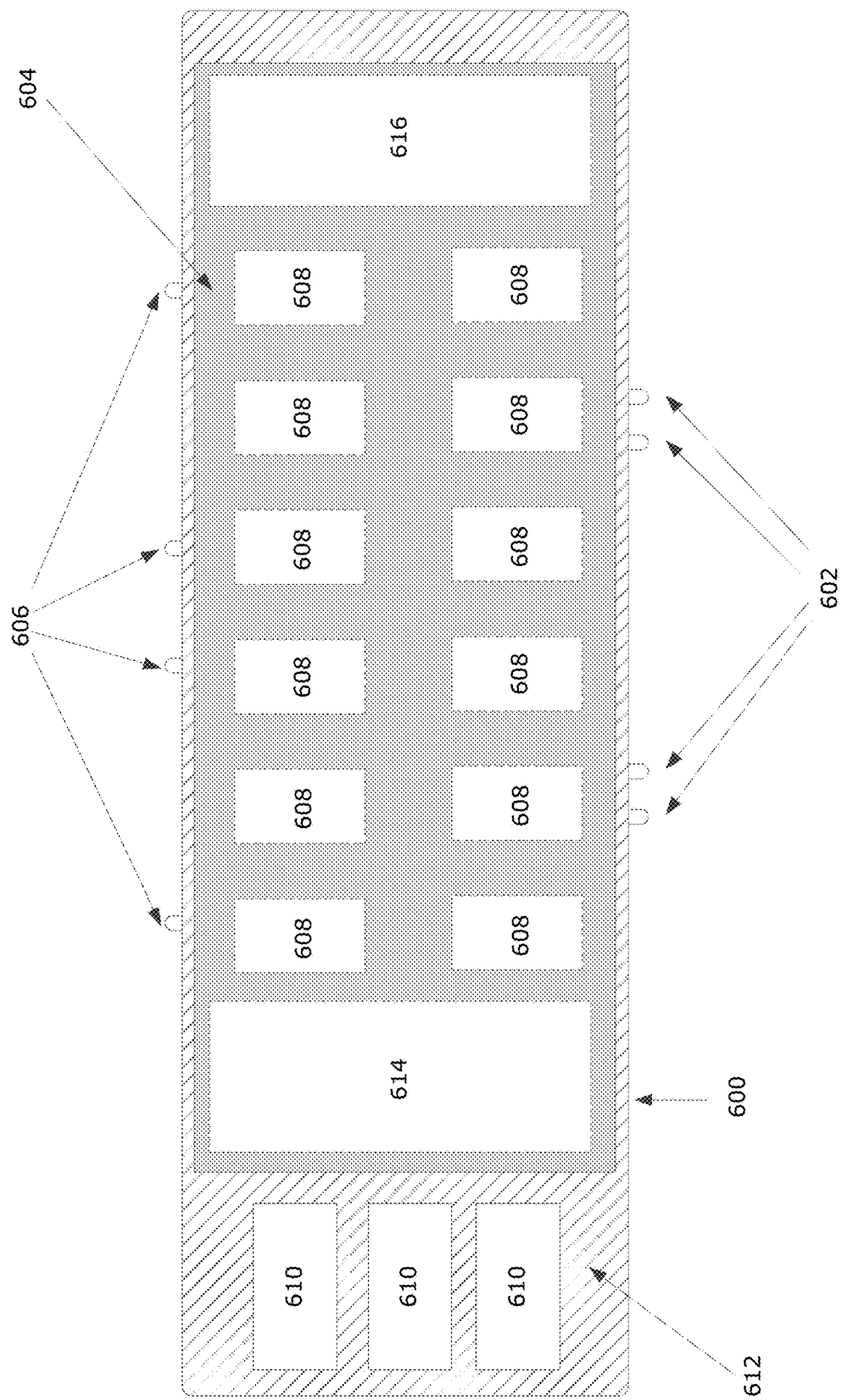
FIG. 6 illustrates a waterborne data center top sectional view
Figure 7:
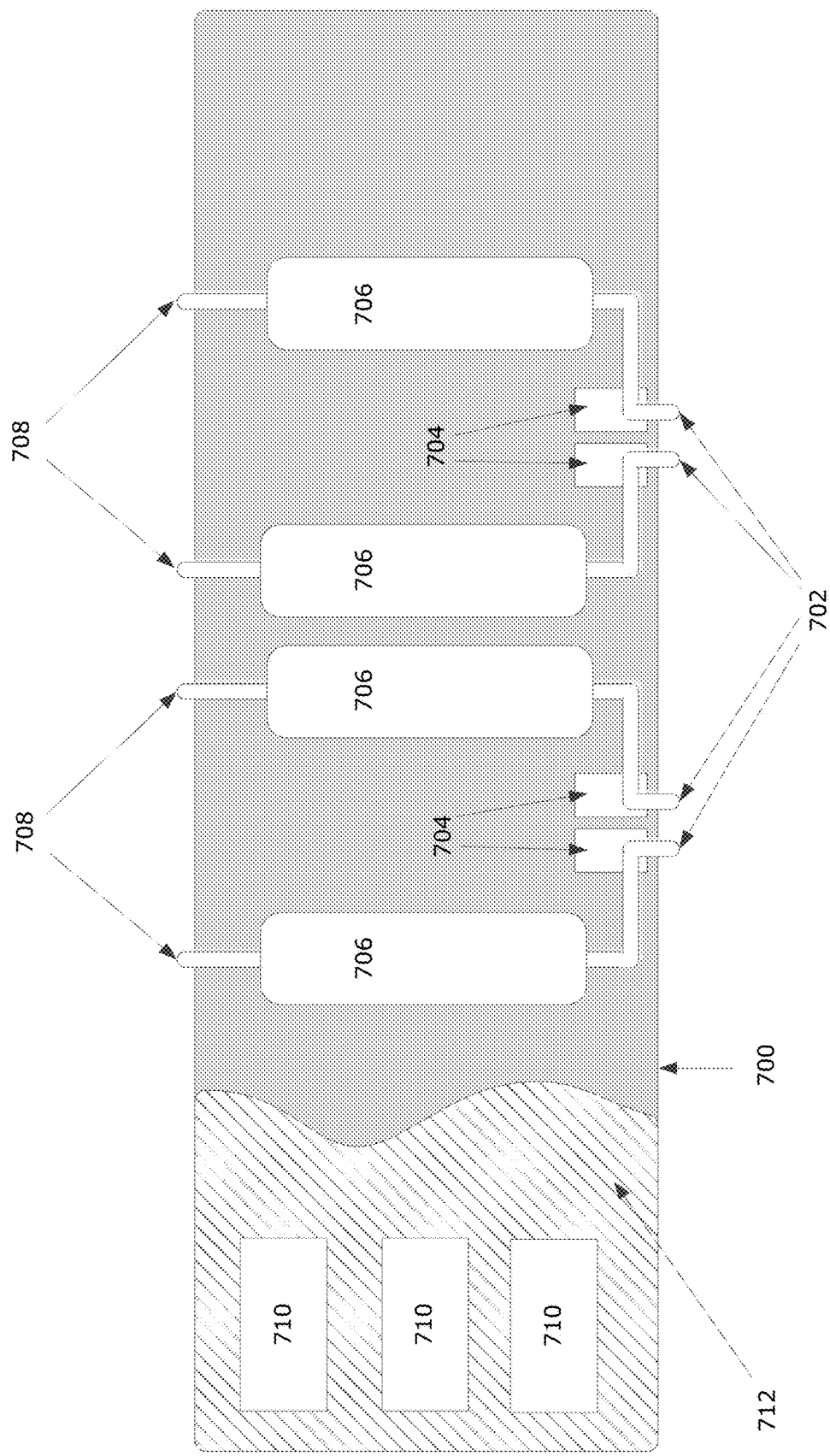
FIG. 7 illustrates a waterborne data center top sectional view below main deck
Figure 8:
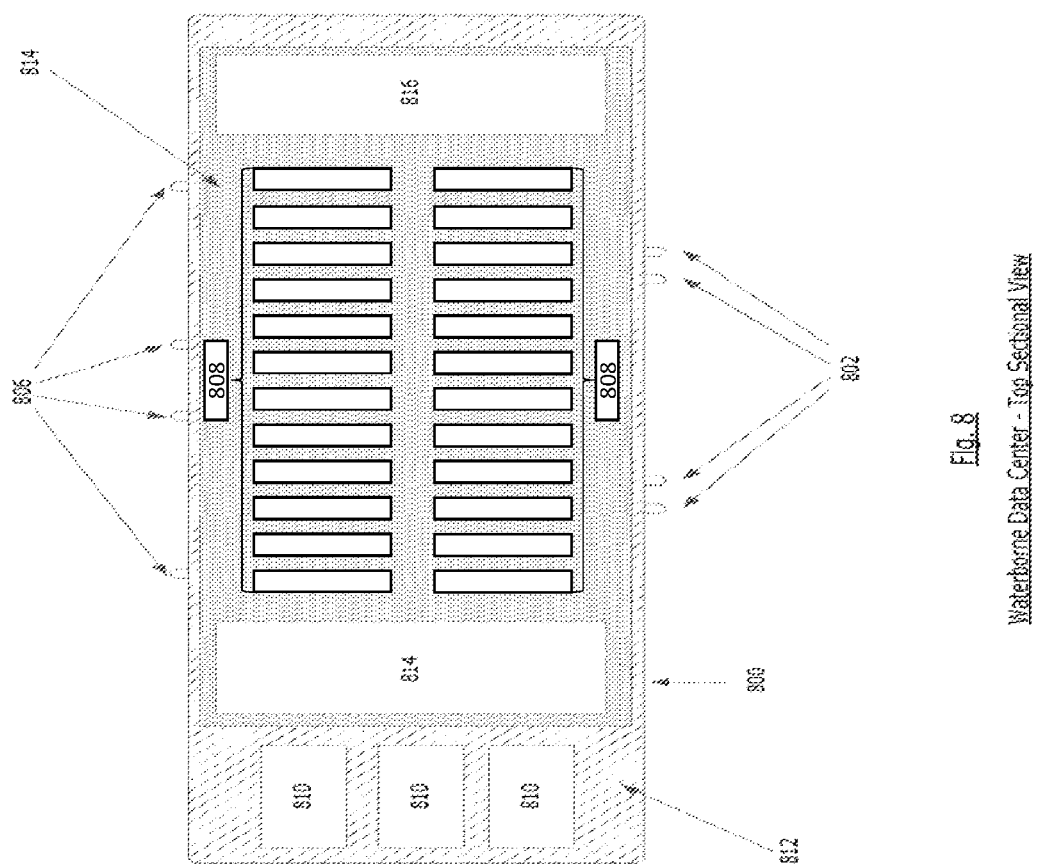
FIG. 8 illustrates a waterborne data center top sectional view

An embodiment includes the following: 1. A Purpose-built marine vessel (FIG. 5, 500; FIG. 6, 600; FIG. 7, 700; FIG. 8, 800); 2. A Hull heat exchange system (FIG. 1, 102; FIG. 2, 202); 3. A water based closed-looped cooling system (FIG. 1, 104; FIG. 2, 204; FIG. 3, 302; FIG. 4, 402; FIG. 5, 516; FIG. 6, 616; FIG. 8, 816); 4. A thermal containment system (FIG. 2, 206; FIG. 3, 300; FIG. 4, 400); 5. A thermal airflow system (FIG. 1, 106; FIG. 2, 208; FIG. 3, 308; FIG. 4, 408); 6. A hot water return cooling system (FIG. 1, 108; FIG. 2, 210); and 7. A management software suite Relationship Between the Components:

FIG. 1 illustrates a submersible marine vessel data center front sectional view. According to an embodiment, water borne data center 100 comprises a heat exchanger 102 (wherein, in an optional embodiment the heat exchanger is partially or wholly comprised in the hull of the water borne data center), a water based closed loop cooling system 104, and a hot water return cooling system 108.

According to an embodiment the submersible marine vessel (1) is used to house all components. The data center space is comprised in the submersible marine vessel, wherein thermal containment systems (4) are built into the data center space in the purpose-built, submersible marine vessel (1). The water based closed-loop cooling system (3) is comprised within the thermal containment system (4) situated behind or above each rack and also within the sides and bottom of the purpose-built, submersible marine vessel (1). The software management suite (7) can be run in the data center within the purpose-built submersible marine vessel (1) or from a remote site.

FIG. 2 illustrates heat exchange and closed-loop cooling side sectional view. According to an embodiment, the water-based closed-loop cooling system (FIG. 1, 104; FIG. 2, 204; FIG. 3, 302; FIG. 4, 402; FIG. 8, 816) comprises filtered water intake pipes (FIG. 5, 502; FIG. 6, 602; FIG. 7, 702; FIG. 8, 802), filtered water exhaust pipes (FIG. 7, 708), water pumps (FIG. 5, 504; FIG. 7, 704; FIG. 8, 804), heat exchangers (FIG. 1, 102; FIG. 2, 202; FIG. 5, 506; FIG. 6, 606; FIG. 7, 706; FIG. 8, 806), coolant heat exchange piping, closed-loop coolant distribution unit that may use freshwater as a coolant, and coolant distribution piping. The data center facility 100 comprises a plurality of computer systems installed in a plurality of data center modules. Data center modules are structurally similar in shape and size to shipping containers. The data center modules in general comprise a plurality of racks, a plurality of rack-mounted computer systems and water-based cooling units. In alternate embodiments, the filtered water intake pipes and filtered water exhaust pipes may be installed in the bow (front) or stern (back) section of the submersible marine vessel instead of on the starboard (right) or port (left) sides of the vessel. The closed-loop coolant distribution unit may be connected to the heat exchangers and to the data center modules according to an embodiment.

FIG. 3 illustrates thermal containment top closed-loop cooling sectional view. FIG. 4 illustrates thermal containment rear closed-loop cooling sectional view. Thermal containment (300, 400) comprises water based closed loop cooling (302, 402), quick connects water (304, 404), and fiber ladder (306, 406). In a preferred embodiment of the submersible marine vessel, the fiber ladder is not required. The heat generated by the computing systems in the data center modules is absorbed by the energy-efficient water-based closed-loop cooling system 302, 402. FIG. 5 illustrates a side sectional view of the submersible marine vessel data center. FIG. 6 illustrates a top sectional view of the submersible marine vessel data center. FIG. 7 illustrates the submersible marine vessel data center top sectional view. And FIG. 8 further illustrates the submersible marine vessel data center top sectional view. According to an embodiment the submersible marine vessel data center comprises the purpose built marine vessel (500, 600, 700, 800), filtered water intake tubes (502, 602, 702, 802), filtered water exhaust tubes 708, water pumps (504, 704, 804), heat exchangers (506, 606, 706, 806), containers (508, 608), row of racks 808, optionally power generators (510, 610, 710, 812), data center facility (512, 604, 810), and closed loop cooling system (516, 616, 816). According to an embodiment, power may be generated from the data center heat, and power generated by or near the body of water (e.g., via waves, tides, wind, currents, temperature differences) may be used to help power the data center. Naturally cold water may be drawn by the water pumps through the filtered water intake pipes to be pumped through one side of the heat exchangers where it serves as a heat sink to cool the hot coolant from the coolant distribution unit being pumped through the other side of the heat exchangers. The naturally cold water after absorbing the heat from the hot coolant may then be pumped from the submersible marine vessel data center facility and expelled through filtered water exhaust pipes. In an embodiment, freshwater may be used as a coolant wherein the coolant is pumped to the data center module cooling units (not pictured) where it absorbs heat generated by the plurality of computing systems therein. The heated coolant is returned from the data center module cooling units, pumped through one side of the heat exchangers while naturally cold water is being pumped through the other side of the heat exchanger absorbing heat from the hot coolant.

The software management suite further comprises a Data Center Infrastructure Management (DCIM) system with predictive analytics and configured for continuously collecting and analyzing data from a plurality of infrastructure systems, components and wireless sensors. A plurality of sensors may be employed to continuously collect environmental data. The data collected by the DCIM system may be stored in a database. The stored data may then be analyzed by a predictive analytics engine. The analyzed data may be employed by the DCIM element controller to manage infrastructure systems and components' operational states to sustain optimal infrastructure efficiency.

Presentation software comprised in the DCIM permits viewing of all the collected and analyzed data by an end user with the presentation software, and the DCIM system may be accessible over a secure IP network.

Embodiments disclosed may incorporate a system and method for intelligent power management employing a data collection layer that continuously collects data from a plurality of infrastructure elements, application elements, power elements and virtual machine elements. The data collected may then be analyzed by a plurality of analytic engines with the resulting data analysis triggering automation software comprised in the system that cause and enable the system to make data center operational state changes for application load balancing.

According to an embodiment, the purpose-built submersible marine vessel (1) is designed to comprise a heat exchange system (1) and to also cool the hot water returned from the water based closed-loop cooling system (3) acting as a hot water return cooling system (3). Some embodiments are designed to utilize the hull as a heat exchanger, wherein the heat exchange system is partially or completely comprised in the hull of the submersible marine vessel. All of the components are monitored and controlled by the software management suite (7). Logic designed to run the software management suite (7) can be implemented in several ways, with several variations and modifications, as would be apparent to a person having ordinary skill in the art.

A preferred embodiment design includes a purpose-built submersible marine vessel to serve as a data center that will be submerged in water. According to an alternate embodiment, the marine vessel is built to serve as a data center, floating on a water body. All components mentioned, namely, the heat exchange system, the water based cooling system, the hot water return cooling system, the thermal containment system, and the software management suite, are installed in such a way that leverages the surrounding environment (Nature) for cooling and wherein all components work together to manage heat created from IT load in the data center while achieving both energy efficiency and cost effectiveness. Some embodiments even leverage the heat created by the IT equipment to generate power for the data center.

Figure 9:
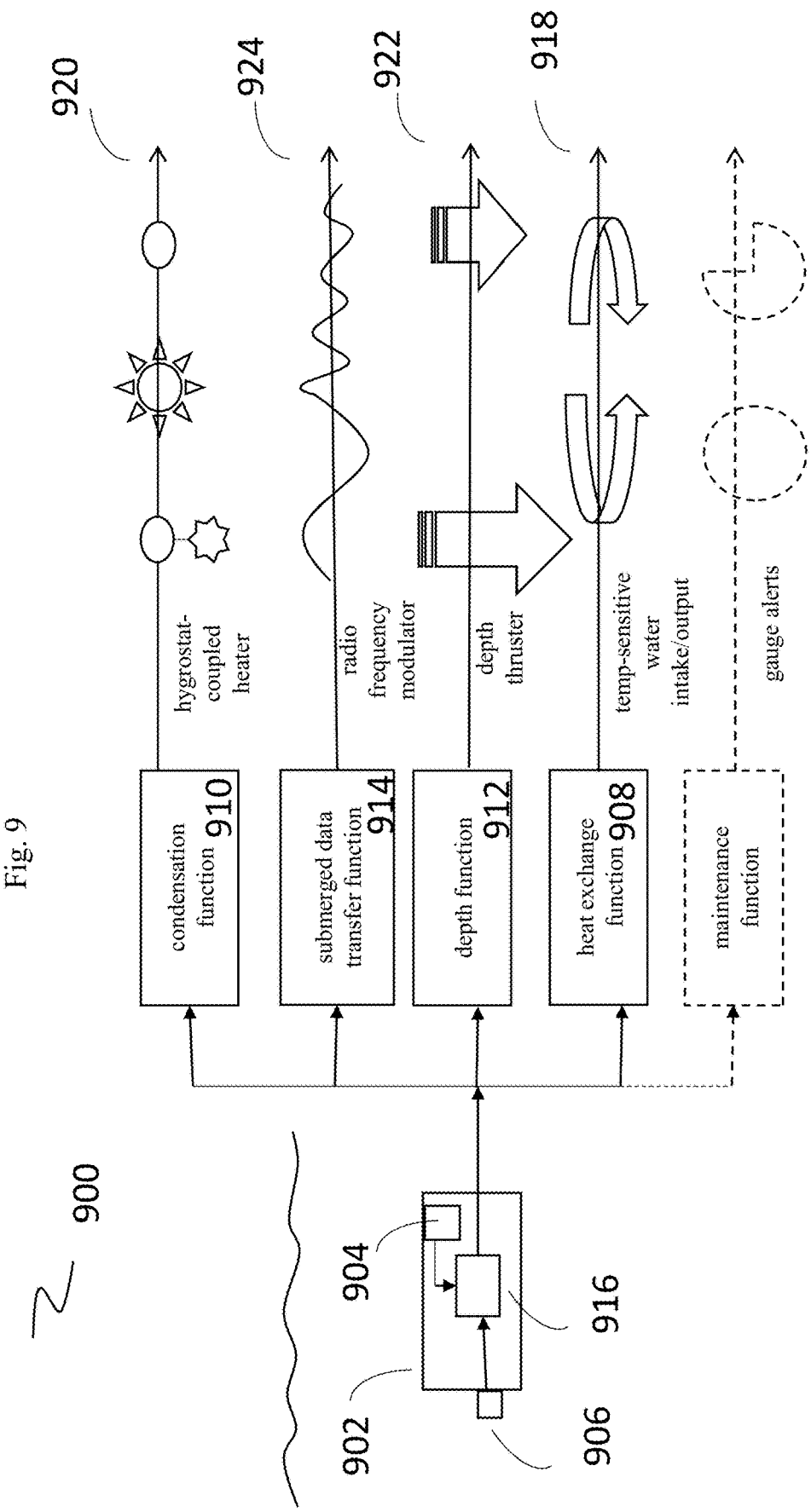
FIG. 9 illustrates a block diagram of the feed-back control system of a submerged data center.

FIG. 9 illustrates a block diagram of the feedback-control system of a water-submerged data center, in accordance with an embodiment of the invention. Shown is a system 900 for feedback-driven control in a water-submerged data center 902, wherein the system comprises a processing unit coupled to a memory element, and instructions encoded thereon, which instructions cause the system to: monitor at least one of an operations output and, or an environmental characteristic data by at least one sensor 904 embedded within a data center enclosure submerged in water and, or at least one sensor 906 disposed on an outer surface of the submerged enclosure. Based on the received operations output and/or environmental characteristic data by the at least one sensor 904/906 embedded within the submerged enclosure and/or disposed on the enclosed enclosure, generate an operational state change for at least one of a heat exchange function 908, condensation function 910, depth function 912, and submerged data transfer function 914.

In some embodiments, only one of the preceding functions are controlled as a result of the feedback-driven operational state change. In other embodiments, any one of, or combination of, functions are controlled by the feedback-driven operational state change. In one embodiment, a distinct sensor input may activate a feedback control pathway involving its corresponding operational state change function. In yet other embodiments, a distinct sensor input may activate a multiple feedback control pathway. For instance, a threshold-grade delta in relative humidity may activate the hygrostat-coupled heater 920 to mitigate condensation, along with activating the depth thrusters 922 to adjust depth levels of the submerged enclosure.

Additionally, in some embodiments, the feedback control pathway may dynamically control output from any one of, or combination of, a heat exchanger 918, closed loop tubular piping, water intake pipes, water exhaust pipes, coolant distribution unit, hygrostat-coupled heater 920, depth thruster 922, and, or a radio-frequency modulator 924. In other embodiments, the hygrostat-coupled heater 920 is comprised within and, or operatively coupled to a dehumidifying unit and the radio-frequency modulator 924 is comprised within and, or operatively coupled to a submerged data transfer unit.

Still in reference to FIG. 9, in some embodiments, an operational state change controller 916 may be present for generating an operational state change for at least one of a heat exchange function, condensation function, depth function, and, or a submerged data transfer function based on at least one of the operations output and, or the environmental characteristic data. Operational state change controller 916 may be encoded with pre-defined logic for the most efficient feedback control pathway. Additionally, the operational state change controller 916 may be encoded with instructions which cause, via machine learning algorithms, to control each component comprised in the data center, and control the plurality of operations of the data center.

While not shown in FIG. 9, the operational state change controller 916 may be operatively coupled to the Data Center Infrastructure Management (DCIM) system or comprised within the DCIM system as the DCIM element controller. The DCIM system may be configured for continuously collecting and analyzing data from a plurality of infrastructure systems, components and wireless sensors. A plurality of sensors may be employed to continuously collect environmental data. The data collected by the DCIM system may be stored in a database. The stored data may then be analyzed by a predictive analytics engine. The analyzed data may be employed by the DCIM element controller or operational state change controller 916 to manage infrastructure systems and components' operational states to sustain optimal infrastructure efficiency.

In terms of the heat exchange control function 908, the coolant distribution unit is caused to circulate coolant through the coolant heat exchange piping, wherein the water pumped through the filtered water intake pipes is caused to transport heat absorbed by the single or plurality of heat exchangers 918. When temperatures cross a threshold, the operational state change corresponding to the heat exchanger 918 may be the opening and, or closing of any one of water intake/output valve. In order to exploit the colder water temperatures of deeper water, the depth thruster 922 may be activated to cause propulsion of the submerged data center to achieve a greater depth. The putative colder temperatures may, in turn, result in increasing the RH delta and activating the hygrostat-coupled heater 920. Furthermore, the increased depth may result in activation of the radio-frequency modulator 924 for increasing bandwidth of wireless transfer of the data.

While also not shown in FIG. 9, a hygrostat-coupled heater 920 may remove condensation from electrical components within the submerged enclosure upon a threshold-grade relative humidity delta being reached. The hygrostat-coupled heater 920 may be comprised within and, or operatively coupled to a dehumidifying unit. The hygrostat-coupled heater 920 may have an integrated fan or radiant heater that assists the natural convection and provides fast distribution of the heat in the electrical enclosure. The fan and, or heaters is coupled to the hygrostat, and is activated upon a threshold-grade RH delta or just prior to internal air dew point is reached. Once RH equilibrium is restored or the dew point is returned below the threshold, the fan and or heaters coupled to the hygrostat is turned off.

Another operational state change may be changing the depth of water in order to intake cooler temperature for stabilizing and increasing driving force for the heat exchangers 918 (not shown). Depths of the submerged data center may be achieved by activating the depth thruster 922, disposed on any one of an outer surface of the submerged enclosure. The depth thruster may be a DC brushless electric thruster capable of causing the submerged enclosure comprising the data center with any degree of at least one of a forward propulsion, reverse propulsion, depth propulsion, tilt, and, or rotation. In other embodiments, the submerged data center is tethered to the floor bed of the body of water, mooring, dock slip, and, or terrestrial data center facility. Depth thrusters 922 may be adjusted manually or by the DCIM/operational state change controller 916 based on input data, controller data, and, or length of tether.

Yet another operational state change may be related to wired or wireless data transfer in the submerged environment (also not shown). According to an embodiment implementing wireless data transfer, radio-frequency modulator 924 may be comprised in and, or operatively coupled to a submerged data transfer unit and cause a change in a radio frequency networking range in order to maintain an even packet loss rate as data is communicated from any one of a sensor hub, transducer module, and, or terrestrial transceiver based on the operational and, or environmental condition. Based on studies, increased transmission distance in leads to a significant packet loss rate as you go further in depth. The standard operating frequency may be in the 2.4 GHz band. This frequency is conducive for dipole relaxation of water molecules, while still having a reasonable depth penetration. Depending on the depth of water, the frequency may change in order to maintain equivalent depth penetration. The standard networking protocol for short-range underwater communication may be Zigbee, which operates at significantly lower power than Wi-Fi, and at a significantly lower data rate. However, any other networking protocol may be used, such as Bluetooth, UWB Zigbee or Wi-Fi.

The submerged data transfer may further comprise an outer surface of the submerged enclosure coated with a marine-grade concrete-based material with an irregular surface for acting as a substrate for supporting marine-life occupancy. The marine-grade material may encompass the entire enclosure with a lapse for access into internal mechanics, server blades, etc. for maintenance, repair and other administrative functions.

Preferred embodiments include all of the above mentioned elements. Alternate embodiments utilize renewable energy sources such as solar photovoltaic, solar thermal, wind energy, tidal wave energy, thermal energy, etc. which can be leveraged for additional energy efficiency. Additionally, heat from the IT equipment transferred to the hot water return from the water based cooling system could also be used as a renewable energy source or used as part of a waste heat system.

The thermal containment and water based closed-loop cooling system can all be reconfigured and purpose built to be used in office buildings, residential homes, schools, government buildings, cruise ships, naval vessels, mobile homes, temporary work sites, remote work sites, hospitals, apartment buildings, etc. Other variations, modifications, and applications are possible, as would be apparent to a person having ordinary skill in the art.

To use this invention, one would simply install their servers/equipment in our waterborne data center facility.

Additionally, partial or complete embodiments of the disclosed invention can be utilized in alternate applications without departing from the scope and spirit of the disclosure. For example, water based closed loop cooling systems that leverage natural resources within close proximity can be utilized to cool virtually anything, including but not limited to buildings or dwellings, in an energy—efficient and cost—effective manner.

Since various possible embodiments might be made of the above invention, and since various changes might be made in the embodiments above set forth, it is to be understood that all matter herein described or shown in the accompanying drawings is to be interpreted as illustrative and not to be considered in a limiting sense. Thus it will be understood by those skilled in the art of water borne vessels, and computer data centers and that although the preferred and alternate embodiments have been shown and described in accordance with the Patent Statutes, the invention is not limited thereto or thereby.

The figures illustrate the architecture, functionality, and operation of possible implementations of systems, methods and computer program products according to various embodiments of the present invention. It should also be noted that, in some alternative implementations, the functions noted/illustrated may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof Some portions of embodiments disclosed are implemented as a program product for use with an embedded processor. The program(s) of the program product defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive, solid state disk drive, etc.); and (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-accessible format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus the invention should not be limited to use solely in any specific application identified and/or implied by such nomenclature.

The present invention and some of its advantages have been described in detail for some embodiments. It should be understood that although the system and process is described with reference to a water borne data center, the system and process may be used in other contexts as well. It should also be understood that various changes, substitutions and alterations can be made herein without departing from the spirit and scope of the invention as defined by the appended claims. An embodiment of the invention may achieve multiple objectives, but not every embodiment falling within the scope of the attached claims will achieve every objective. Moreover, the scope of the present application is not intended to be limited to the particular embodiments of the process, machine, manufacture, composition of matter, means, methods and steps described in the specification. A person having ordinary skill in the art will readily appreciate from the disclosure of the present invention that processes, machines, manufacture, compositions of matter, means, methods, or steps, presently existing or later to be developed are equivalent to, and fall within the scope of, what is claimed. Accordingly, the appended claims are intended to include within their scope such processes, machines, manufacture, compositions of matter, means, methods, or steps.

We claim:

1. A submersible marine vessel comprising:
a heat exchange system;
a water based cooling system operatively coupled to the heat exchange system and comprising a first and second single or plurality of filtered water pipes wherein the first and second single or plurality of filtered water pipes are operable as water intake pipes and water exhaust pipes;
a computer data center, wherein the computer data center comprises a plurality of computing units, a radio-frequency modulator, and wherein the computer data center is comprised in the submersible marine vessel;
a depth thruster disposed on an outer surface of the submersible marine vessel, and configured to cause a forward propulsion, a reverse propulsion, a depth propulsion, a tilt, and a rotation of the submersible marine vessel;
a hygrostat coupled heater operatively coupled to a dehumidifying unit;
a hot water return cooling system configured to cool hot water returned from a water based closed-loop cooling system comprised in the heat exchange system; and
a software management suite comprising a Data Center Infrastructure Management (DCIM) system configured for collecting data from at least one sensor embedded within the computer data center enclosure submerged in water and at least one sensor disposed on the outer surface of the submersible marine vessel, wherein the data collected from the at least one sensor embedded within the computer data center enclosure and the at least one sensor disposed on the outer surface are used to monitor an operations output and environmental characteristic, and the depth thruster is activated based on the operations output and environmental characteristic to adjust depth levels of the computer data center contained within the submersible marine vessel, thereby managing infrastructure systems and operational states of the computer data center to sustain a desired efficiency.

2. The submersible marine vessel of claim 1 further comprising: a bow section, a stern section, a starboard section, and a port section.

3. The submersible marine vessel of claim 1 further comprises: a closed loop coolant distribution unit coupled to the water-based cooling system via a single or plurality of heat exchangers and corresponding heat exchange piping;
a single or plurality of water pumps; and
coolant distribution piping.

4. The submersible marine vessel of claim 1 further comprising a hull section wherein the heat exchange system is partially or completely comprised in the hull of the marine vessel, making for a hull heat exchange system, or a hull heat exchanger.

5. The submersible marine vessel of claim 1 wherein the Data Center Infrastructure Management (DCIM) system comprises predictive analytics and is configured for continuously collecting and analyzing data from a plurality of infrastructure systems, components and sensors, including the at least one sensor embedded within the computer data center enclosure submerged in water and at least one sensor disposed on the outer surface of the submersible marine vessel.

6. The submersible marine vessel of claim 1 further comprising a system for feedback-driven control wherein the system comprises a processing unit coupled to a memory element, and instructions encoded thereon, which instructions cause the system to:
based on the monitored operations output and environmental characteristic, generate an operational state change for at least one of a heat exchange function, a condensation function, a depth function, and a data transfer function.

7. The submersible marine vessel of claim 1 further comprising an operational state change controller operatively coupled to the data center infrastructure management (DCIM) system and configured to continuously collect and analyze infrastructure systems, components and environmental data from a plurality of networked sensors; and
   wherein the data center infrastructure management system further comprises a DCIM element controller configured to calibrate infrastructure systems, components and environmental conditions based on the collected and analyzed data.

8. In a submersible marine vessel comprising a data center facility, a method comprising:
   generating electrical power and providing the generated electrical power to the data-center, wherein any excess power is stored as back up in the submersible marine vessel;
   pumping surrounding water and circulating the pumped water through a closed loop cooling system;
   wherein the closed loop cooling system is comprised in a heat exchanger;
   wherein the surrounding water is drawn by water pumps through a first single or plurality of filtered water pipes to be pumped through a first side of the heat exchanger, where it serves as a heat sink to cool hot coolant from a coolant distribution unit, pumped through a second side of the heat exchanger; and
   expelling the pumped water after absorbing the heat from the hot coolant through a second single or plurality of filtered water pipes;
   wherein the first and second single or plurality of filtered water pipes are operable as water intake pipes and water exhaust pipes;
   activating a depth thruster to cause propulsion of the submersible marine vessel, wherein the depth thruster is disposed on an outer surface of the submersible marine vessel, and is configured to cause a forward propulsion, a reverse propulsion, a depth propulsion, a tilt, and a rotation of the submersible marine vessel, wherein the depth thruster is controlled with aid of a software management suite, and is activated based on an operations output and environmental characteristic calculated based on data collected from at least one sensor embedded within the computer data center enclosure and at least one sensor disposed on the outer surface to adjust depth levels of the data center facility contained within the submersible marine vessel, thereby managing infrastructure systems and operational states of the data center facility to sustain a desired efficiency;
   activating a hygrostat-coupled heater operatively coupled to a dehumidifier to control environmental humidity; and
   based on achieved greater depth, activating a radiofrequency modulator for increasing bandwidth of wireless transfer of data.

9. The method of claim 8 further comprising:
   collecting of environmental data by a plurality of infrastructure systems, components and sensors, including the at least one sensor embedded within the computer data center enclosure submerged in water and at least one sensor disposed on the outer surface of the submersible marine vessel;
   storing the collected data in a database;
   analyzing the stored data by a predictive analytics engine, wherein the analyzed data is employed by a Data Center Infrastructure Management (DCIM) element controller of the software management suite to manage infrastructure systems and components' operational states.

10. The method of claim 8 further comprising controlling a condensation function, a depth function, and wireless data transfer function based on a feedback-control system, housed within the submersible marine vessel.

11. The method of claim 8 further comprising,
   via a system for feedback-driven control:
   based on the calculated operations output and environmental characteristic,
   generating an operational state change for at least one of a heat exchange function, a condensation function, a depth function, and a data transfer function.

12. The method of claim 8 further comprising, via an operational state change controller operatively coupled to the software management suite and configured to continuously collect and analyze infrastructure systems, components and environmental data from a plurality of networked sensors:
   calibrating the infrastructure systems, components and environmental conditions based on the collected and analyzed data.

13. The submersible marine vessel of claim 1 wherein the depth thruster is a DC brushless electric thruster.

14. The submersible marine vessel of claim 1, wherein the data collected comprises temperature data, and wherein the depth thruster is activated to adjust to achieve a depth level of the submersible marine vessel to achieve a desired environmental water temperature.

15. The submersible marine vessel of claim 14, wherein the depth level of the submersible marine vessel is controlled to adjust a temperature of the computer data center contained within the submersible marine vessel.

16. The submersible marine vessel of claim 14, wherein data from the hygrostat in response to the adjusted depth level and resulting temperature activates the hygrostat-coupled heater.

17. The submersible marine vessel of claim 14, wherein the adjusted depth level causes the activation of the radiofrequency modulator to adjust bandwidth of wireless transfer of the data.

18. The submersible marine vessel of claim 14, wherein the first and second single or plurality of filtered water pipes based on the operations output and environmental characteristic adjust a temperature of the computer data center contained within the submersible marine vessel.

* * * * *